(12) United States Patent  
Chapman

(10) Patent No.: US 7,271,018 B2
(45) Date of Patent: Sep. 18, 2007

(54) METHOD OF FORMING A SUPPORT FRAME FOR SEMICONDUCTOR PACKAGES

(75) Inventor: Gregory M. Chapman, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 269 days.

(21) Appl. No.: 11/156,732

(22) Filed: Jun. 21, 2005

(65) Prior Publication Data

US 2005/0236699 A1 Oct. 27, 2005

Related U.S. Application Data

(62) Division of application No. 10/796,115, filed on Mar. 10, 2004, now Pat. No. 6,956,272.

(51) Int. Cl.
H01L 21/00 (2006.01)
(52) U.S. Cl. .......................... 438/20; 257/433
(58) Field of Classification Search .............. 438/6, 438/10, 104–114, 121–123, 128–129, 135, 438/142, 145, 149, 151, 157, 176, 478
See application file for complete search history.

(56) References Cited

U.S. PATENT DOCUMENTS

| 5,790,378 | A | 8/1998 | Chillara | |
|---|---|---|---|---|
| 6,268,650 | B1 | 7/2001 | Kinsman et al. | |
| 6,469,376 | B2 | 10/2002 | Vaiyapuri | |
| 6,541,284 | B2 | 4/2003 | Lam | |
| 7,033,848 | B2 * | 4/2006 | Murakami et al. | 438/20 |
| 2001/0052642 | A1 | 12/2001 | Wood et al. | |
| 2002/0014673 | A1 * | 2/2002 | Leedy | 257/419 |
| 2002/0045297 | A1 * | 4/2002 | Leedy | 438/149 |
| 2004/0132303 | A1 * | 7/2004 | Leedy | 438/689 |
| 2005/0082626 | A1 * | 4/2005 | Leedy | 257/432 |
| 2005/0130351 | A1 * | 6/2005 | Leedy | 438/128 |
| 2005/0156172 | A1 * | 7/2005 | Murakami et al. | 257/72 |
| 2005/0156265 | A1 * | 7/2005 | Leedy | 257/432 |

* cited by examiner

*Primary Examiner*—Michael Lebentritt
*Assistant Examiner*—Andre' Stevenson
(74) *Attorney, Agent, or Firm*—Dickstein Shapiro LLP

(57) ABSTRACT

A semiconductor die package having an elastomeric substrate with a first support frame and a second support frame. The first support frame has a cavity within which a semiconductor die is placed. The second support frame may have an optional cavity. The optional cavity in the second support frame may have an optional rigid structure. The rigid structure may have a heating element formed within it.

20 Claims, 12 Drawing Sheets

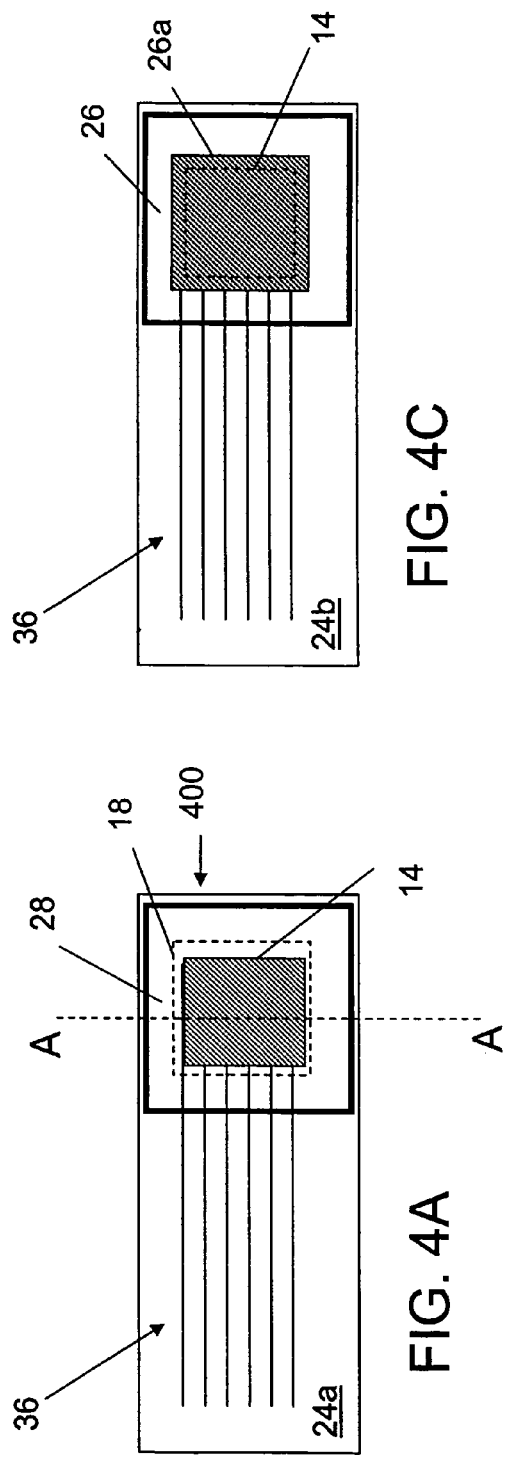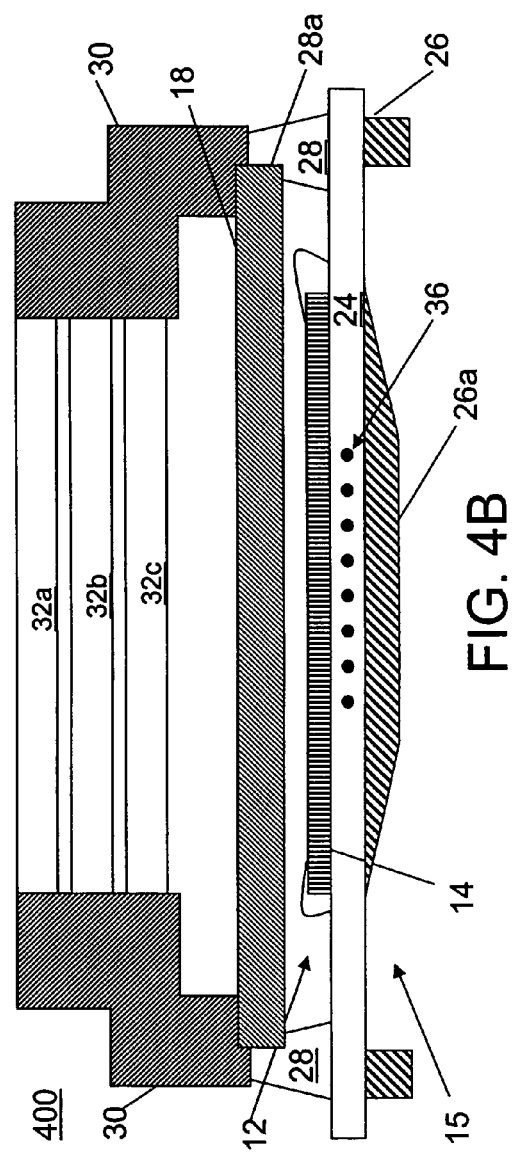

METHOD OF FORMING A SUPPORT FRAME FOR SEMICONDUCTOR PACKAGES

CROSS REFERENCE TO RELATED APPLICATIONS

This application is a divisional of U.S. application Ser. No. 10/796,115, filed on Mar. 10, 2004, now U.S. Pat. No. 6,956,272 the disclosure of which is hereby incorporated by reference in its entirety.

FIELD OF THE INVENTION

The present invention relates generally to a semiconductor die package.

BACKGROUND OF THE INVENTION

Integrated circuits, including a semiconductor die such as charge-coupled-devices (CCD) and complementary metal oxide semiconductor (CMOS) sensors have commonly been used in photo-imaging applications. Such sensors typically contain thousands of pixel cells in a pixel array on a single chip. Pixel cells convert light into an electrical signal that can then be stored and recalled by an electrical device such as, for example, a processor.

Semiconductor dies are typically packaged and inserted into imaging devices such as, for example, a digital camera. FIG. 1 illustrates a cross-sectional view of one conventional semiconductor die package 100. The semiconductor die package 100 includes a ceramic substrate 10 attached to a molded frame 16. A semiconductor die 14 containing an array of pixels is typically placed on the ceramic substrate 10, within a cavity 12 defined by the molded frame 16. The molded frame 16 supports an infrared (IR) lens 18 and a lens holder mount 20. The lens holder mount 20 supports a lens barrel 22, which ultimately includes at least one lens 32.

In operation, light radiation enters the lens 32 of the semiconductor die package 100. Harmful IR radiation is filtered out by the IR lens 18. Light radiation is then adsorbed and image signals created by the array of pixels of the semiconductor die 14, which converts the photons from the light radiation to electrical signals. Wire bonds 13 conduct electrical output signals from the semiconductor die 14 to external circuitry (not shown). The external circuitry may include processing circuits for storing, compressing, manipulating, or displaying an acquired image.

While the package illustrated in FIG. 1 works well, the ceramic substrate 10 is expensive, and adds to the overall cost of the semiconductor die package 100. Additionally, the ceramic substrate 10 is fragile due, in part, to its rigidity. The package 100 is also prone to breaking during processing and handling, thereby lowering yield. Additionally, because the ceramic substrate 10 is rigid, it restricts the compactness of the semiconductor die package 100. Thus, a semiconductor die package which is more cost effective while preserving the rigidity of the overall semiconductor die package is desired.

BRIEF SUMMARY OF THE INVENTION

The present invention, in its various exemplary embodiments, provides a semiconductor die package having an elastomeric substrate with a first support frame and a second support frame. The first support frame has a cavity within which a semiconductor die is placed. The second support frame may have an optional cavity. The optional cavity in the second support frame may have an optional rigid structure. The rigid structure may have an optional heating element formed within it.

BRIEF DESCRIPTION OF THE DRAWINGS

The above-described features of the invention will be more clearly understood from the following detailed description, which is provided with reference to the accompanying drawings in which:

FIGS. 4A-4C illustrate a semiconductor die package constructed in accordance with a third exemplary embodiment of the invention;

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

As used herein, the term "elastomeric substrate" and "flexible substrate" are to be understood to include any material, including, but not limited to, epoxy, polyimide, polyester, or any other material capable of withstanding a 180° angle bend at a radius of at least ⅛" or less. Similarly, an "elastomeric substrate" or "flexible substrate" may be any material having substantially the same or equivalent properties as DuPont Kapton® or Oasis®. Specifically, the material may have a tensile strength of about 10 kpsi or greater, a tensile modulus of about 200 kpsi or greater, and/or an elongation property of about 25% or more (values based on ASTM D-882-83 Method A).

Figure 2A:
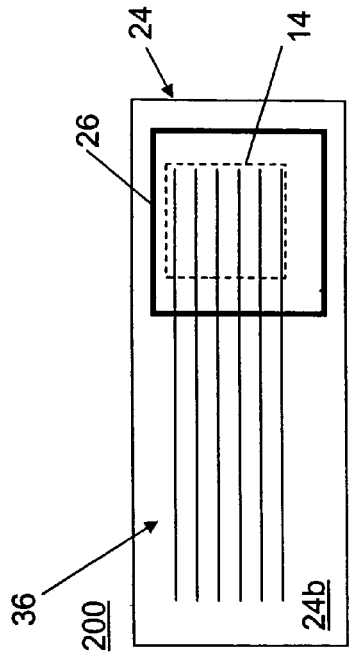
FIGS. 2A-2C illustrate a semiconductor die package constructed in accordance with a first exemplary embodiment of the invention.
Figure 2C:
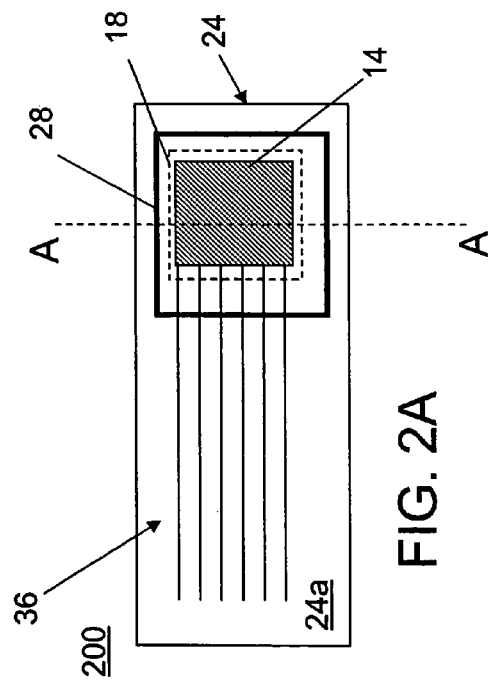
Figure 2B:
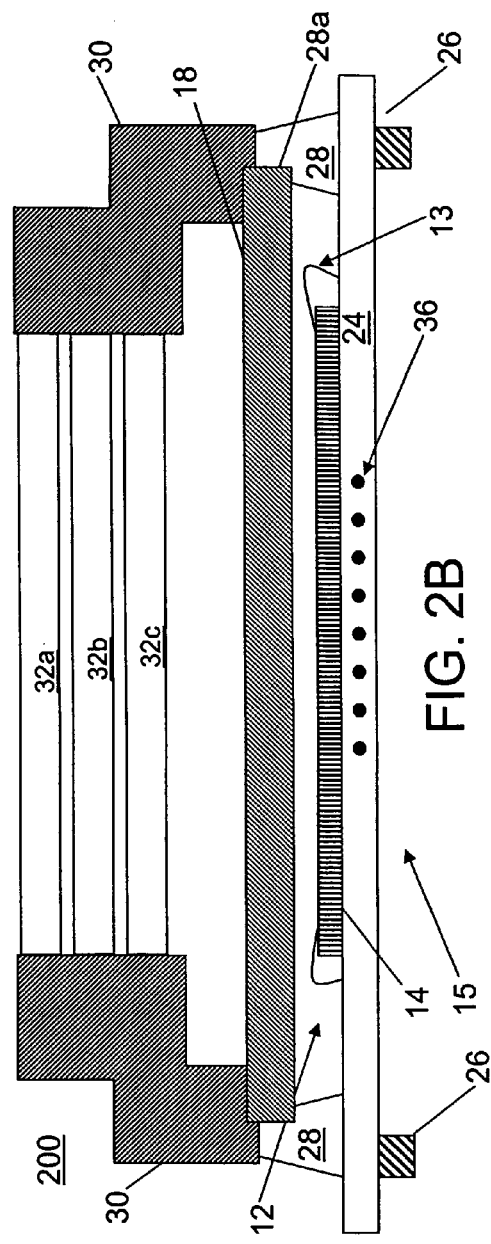

Referring now to the figures, where like reference numbers designate like elements, FIGS. 2A-2C illustrate an exemplary semiconductor die package 200 constructed in accordance with a first embodiment of the invention. Specifically, FIG. 2A illustrates a top-down view of the semiconductor die package 200. FIG. 2B illustrates a cross-sectional view of the semiconductor die package 200, taken along line A-A (FIG. 2A). FIG. 2C illustrates a bottom-up view of the illustrated semiconductor die package 200. The semiconductor die package 200 has an elastomeric substrate 24 for supporting a semiconductor die 14, which contains a pixel array. As illustrated, the semiconductor package 200 has a first support frame 28 defining a cavity 12 attached to a first side 24a of the elastomeric substrate 24, and a second support frame 26 defining a second cavity 15 formed on a second side 24b of the elastomeric substrate, such that the cavity 12 defined by the first support frame 28 and the cavity 15 defined by the second support frame 26 are substantially aligned.

The illustrated semiconductor die package 200 also includes a semiconductor die 14 within the cavity 12 of the first support frame 28. The semiconductor die 14 is electrically connected to conductive lines 36 formed within the elastomeric substrate 24 by wire bonds 13. The first support frame 28 also supports an IR lens 18 that is positioned within optional grooves 28a formed in the first support frame 28. The first support frame 28 also supports a lens housing 30 having one or more lenses; e.g., a plurality of lenses 32a, 32b, 32c are illustrated in FIG. 2B.

Figure 1:
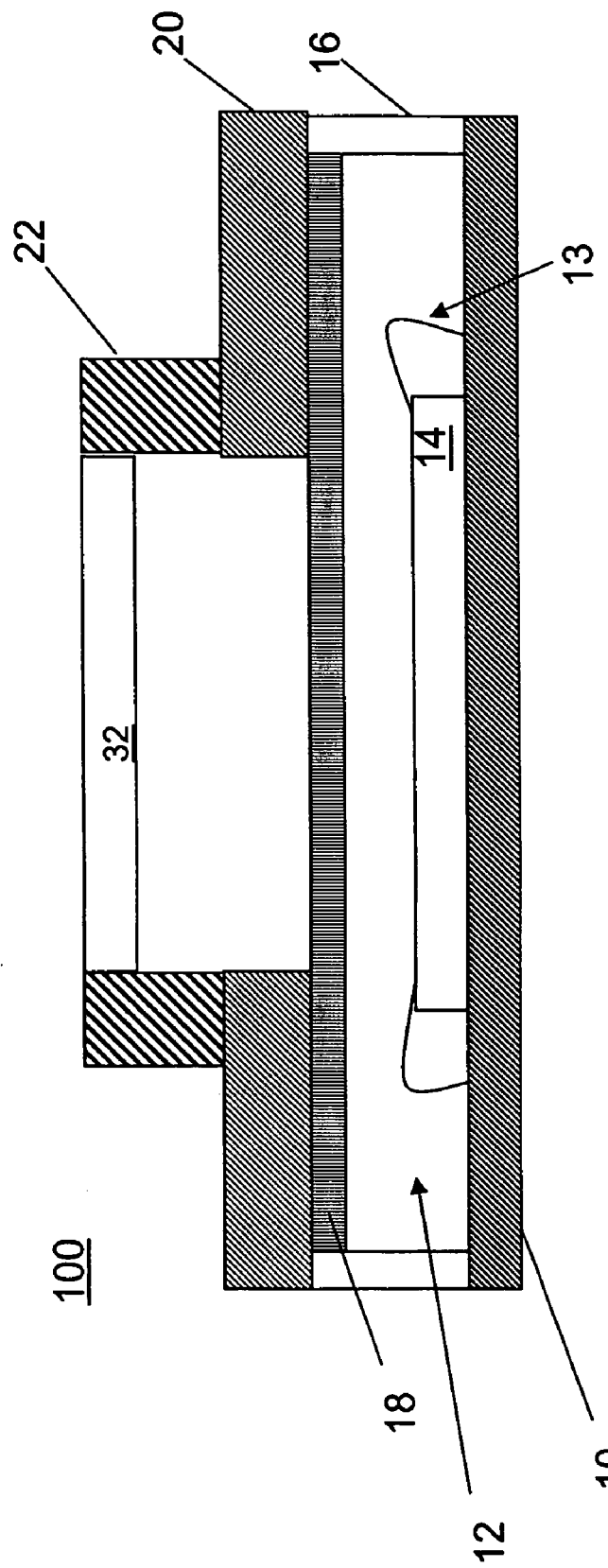
FIG. 1 illustrates a cross-sectional view of a conventional semiconductor die package.

The elastomeric substrate 24 provides greater resistance to breakage during processing, while preserving the overall rigidity necessary for the placement of the semiconductor die 14. The materials comprising the elastomeric substrate 24 are significantly more cost effective than the ceramic substrate 10 of the FIG. 1 semiconductor package 100. Suitable materials for the elastomeric substrate 24 include epoxy, polyimide, polyester, or any other material capable of withstanding a 180° angle bend at a radius of at least ⅛" or less, or any material having substantially the same or equivalent properties as DuPont Kapton® or Oasis®, for example, having a tensile strength of about 10 kpsi or greater, a tensile modulus of about 200 kpsi or greater, and/or an elongation property of about 25% or more (values based on ASTM D-882-83 Method A). Additionally, the elastomeric substrate 24 allows for a more compact design. Because the elastomeric substrate is capable of withstanding a bend of 180° angle at a radius of at least ⅛", the elastomeric substrate 24 can fold on top of itself to help space constraints in certain designs.

The semiconductor die 14 and the conductive lines 36 within the elastomeric substrate 24 may also be electrically connected by conductive pads 17 (FIG. 3B), to provide electrical communication between the semiconductor die 14 and an external device (not shown).

Figure 3A:
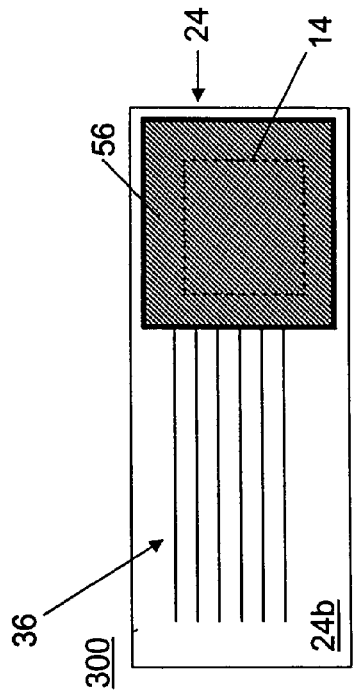
FIGS. 3A-3C illustrate a semiconductor die package constructed in accordance with a second exemplary embodiment of the invention.
Figure 3B:
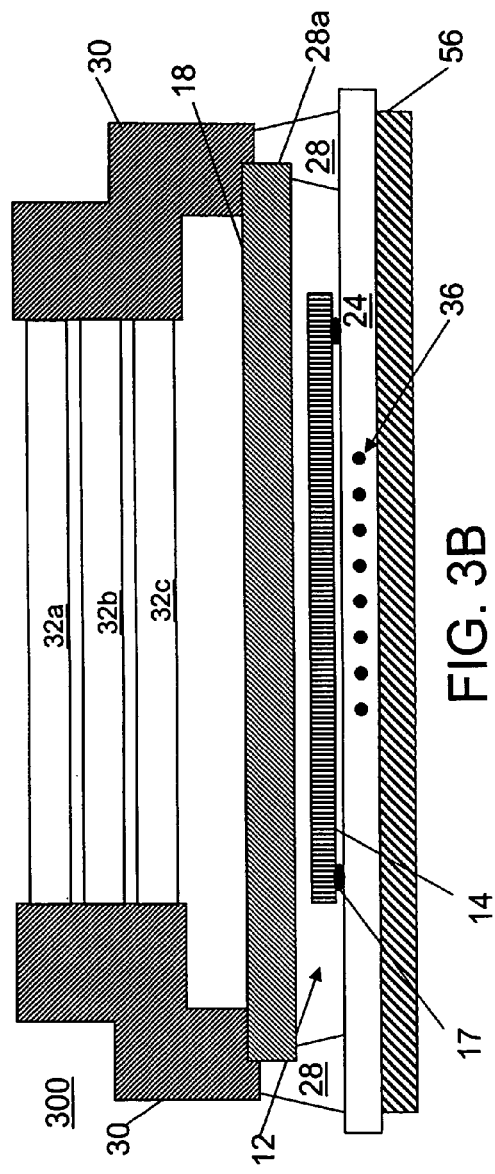
Figure 3C:
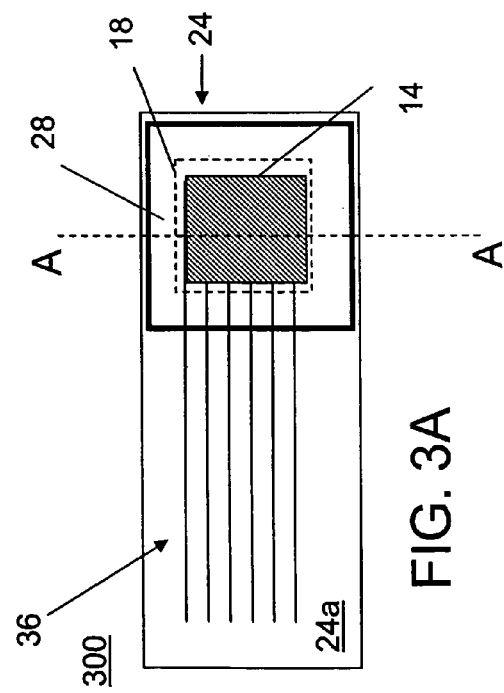

FIGS. 3A-3C illustrate a second exemplary embodiment of the invention. The illustrated semiconductor die package 300 is similar to the FIGS. 2A-2C semiconductor die package 200, with the exception of having a second support frame 56 without a cavity 15 (FIG. 2B). In the illustrated semiconductor die package 300, a portion of the second side 24b of the elastomeric substrate 24 is supported by the second support frame 56. As further shown, the semiconductor die 14 is positioned on the elastomeric substrate 24, and electrically connected to the conductive lines 36 through conductive pads 17 located below the semiconductor die 14. Because the second support frame 56 does not contain a cavity 15 (FIG. 2B), the second support frame 26 provides added rigidity to the semiconductor die package 300.

A third exemplary embodiment of the present invention is illustrated in FIGS. 4A-4C. The illustrated semiconductor die package 400 is similar to the FIG. 2 semiconductor die package 200, with the addition of a support structure 26a formed within the cavity 15 of the second support frame 26, thereby providing support to the second side 24b of the elastomeric substrate 24 directly underneath the first side 24a of the elastomeric substrate 24 having the semiconductor die 14. The support structure 26a can be adhesively attached if desired or embedded within the elastomeric substrate 24 during processing.

Figure 5:
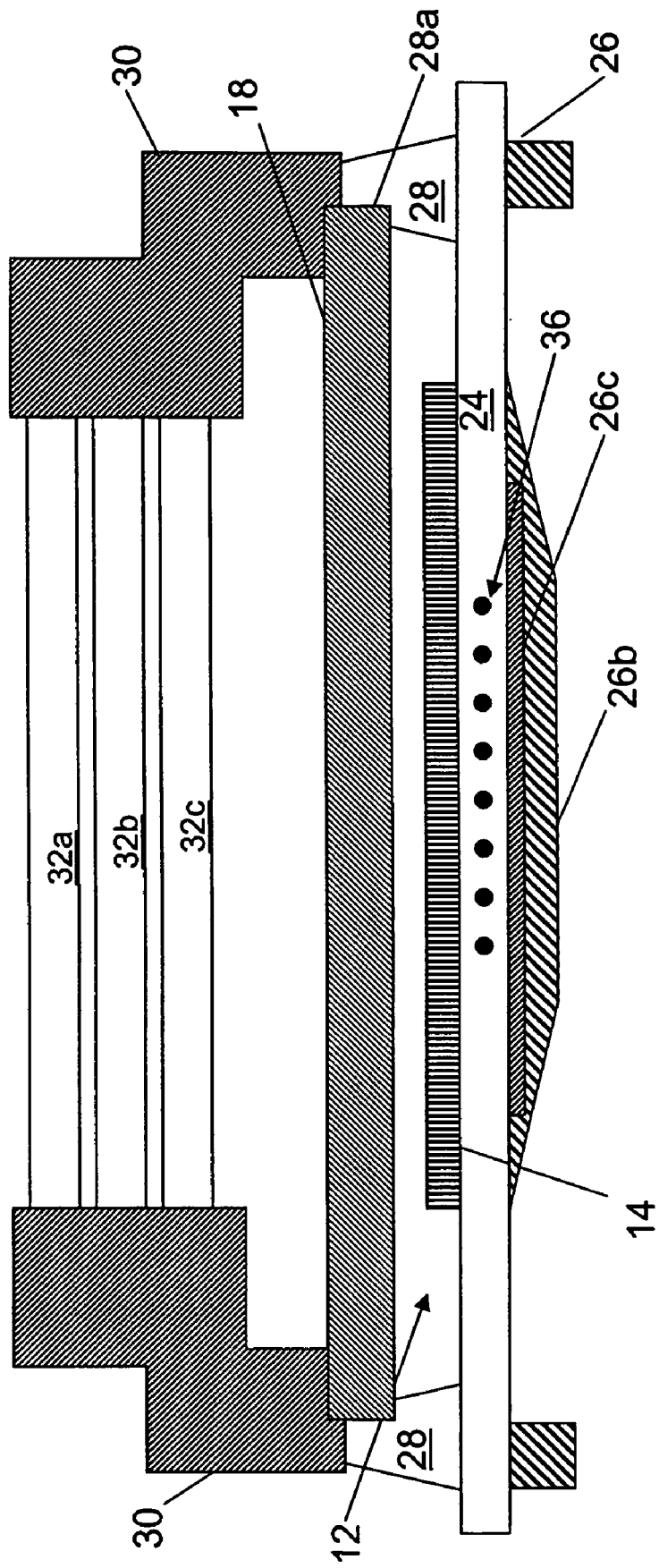
FIG. 5 illustrates a semiconductor die package constructed in accordance with a fourth exemplary embodiment of the invention.

FIG. 5 illustrates, in cross section, a fourth embodiment of a semiconductor die package 500 in accordance with the invention which includes a support structure 26b, which provides for additional support and rigidity. The support structure 26b comprises a heat conductive element 26c that can be made from any heat conductive material such as, e.g., copper. In a configuration in which conductive pads 17 (FIGS. 3A-3C) are used to electrically connect the semiconductor die 14 to the conductive lines 36, heat is used to melt the conductive pads 17. The heat conductive element 26c may be used to heat the portion of the elastomeric substrate 24 directly underneath the semiconductor die 14, thereby melting the conductive pads 17.

The heat conductive element 26c can also be used as a heat sink to channel heat away from the semiconductor die 14 and the elastomeric substrate 24 during use. The heat conductive element 26c also provides additional support for a portion of the elastomeric substrate 24, which, in turn, supports the semiconductor die 14. It should be noted that the heat conductive element 26c can also be incorporated into the FIG. 3 semiconductor die package 300.

The above-described semiconductor die packages 200, 300, 400, 500 are only a few exemplary embodiments of the present invention. For example, although the semiconductor die packages 200, 300, 400, 500 are illustrated as being on an end of a respective elastomeric substrate 24, the semiconductor die packages 200, 300, 400, 500 could be placed anywhere along the length of the elastomeric substrate 24, and, therefore, the invention is not limited to the illustrated embodiments.

Further, semiconductor die packages 200 300, 400, 500 are illustrated with an optional IR lens 18 supported by the first support frame 28; however, the IR lens 18 could be placed directly on the semiconductor die 14, or replaced with an IR filter thereby eliminating the need for the IR lens 18 altogether. In certain applications, an IR filter or IR lens 18 are not needed at all.

Similarly, the illustrated semiconductor die packages 200, 300, 400, 500 have conductive lines that are formed within the elastomeric substrate 24. However, conductive lines 36 may be formed on the surface of either the first or second sides 24a, 24b of the elastomeric substrate 24.

Additionally, although the first and second support frames 28, 26 are described as being adhesively attached to the elastomeric substrate 24, the first and second support frames 28, 26 could be attached to the elastomeric substrate 24 by other methods known in the art. Additionally, the first and second support frames 28, 26 could be formed of the same material, and could be formed as a single integrally molded ring molded on top and bottom surfaces of the elastomeric substrate 24 through holes in the elastomeric substrate 24.

Figure 6:
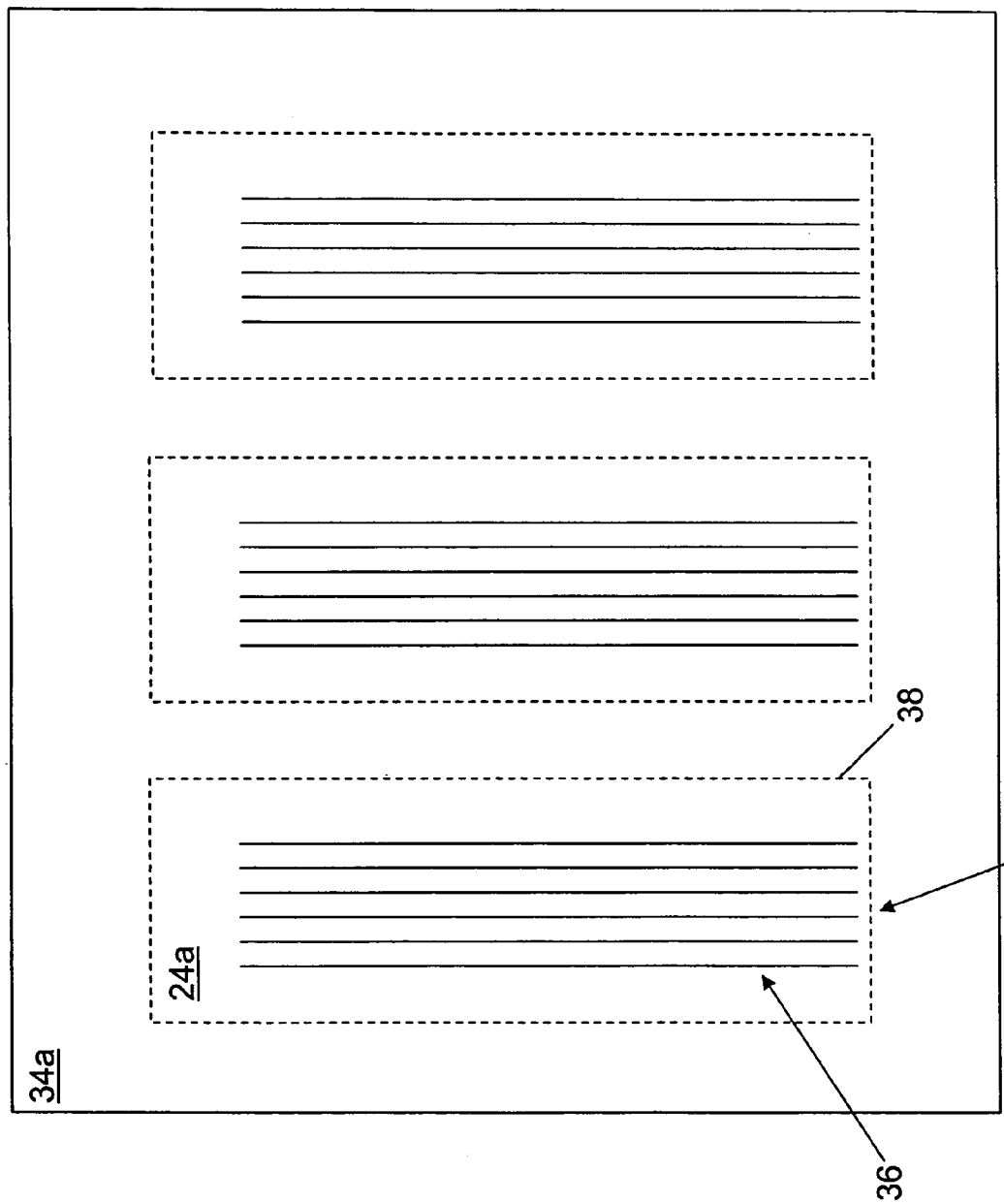
FIGS. 6-7 illustrate top-down views of stages in fabrication of a plurality of semiconductor die packages in accordance with an exemplary embodiment of the invention.

FIGS. 6-10 illustrate stages of an exemplary method of forming the FIG. 2 semiconductor die package 200. FIG. 6 illustrates a top-down view of a first side 34a of an elastomeric film precursor 34. The elastomeric film precursor 34 is formed to have conductive lines 36. The elastomeric film precursor 34 is perforated to form perforated lines 38 that divide the elastomeric film precursor 34 into a plurality of elastomeric substrates 24. Depending on the desired result, the conductive lines 36 could terminate before the perforated lines 38, or could extend thereto.

Figure 7:
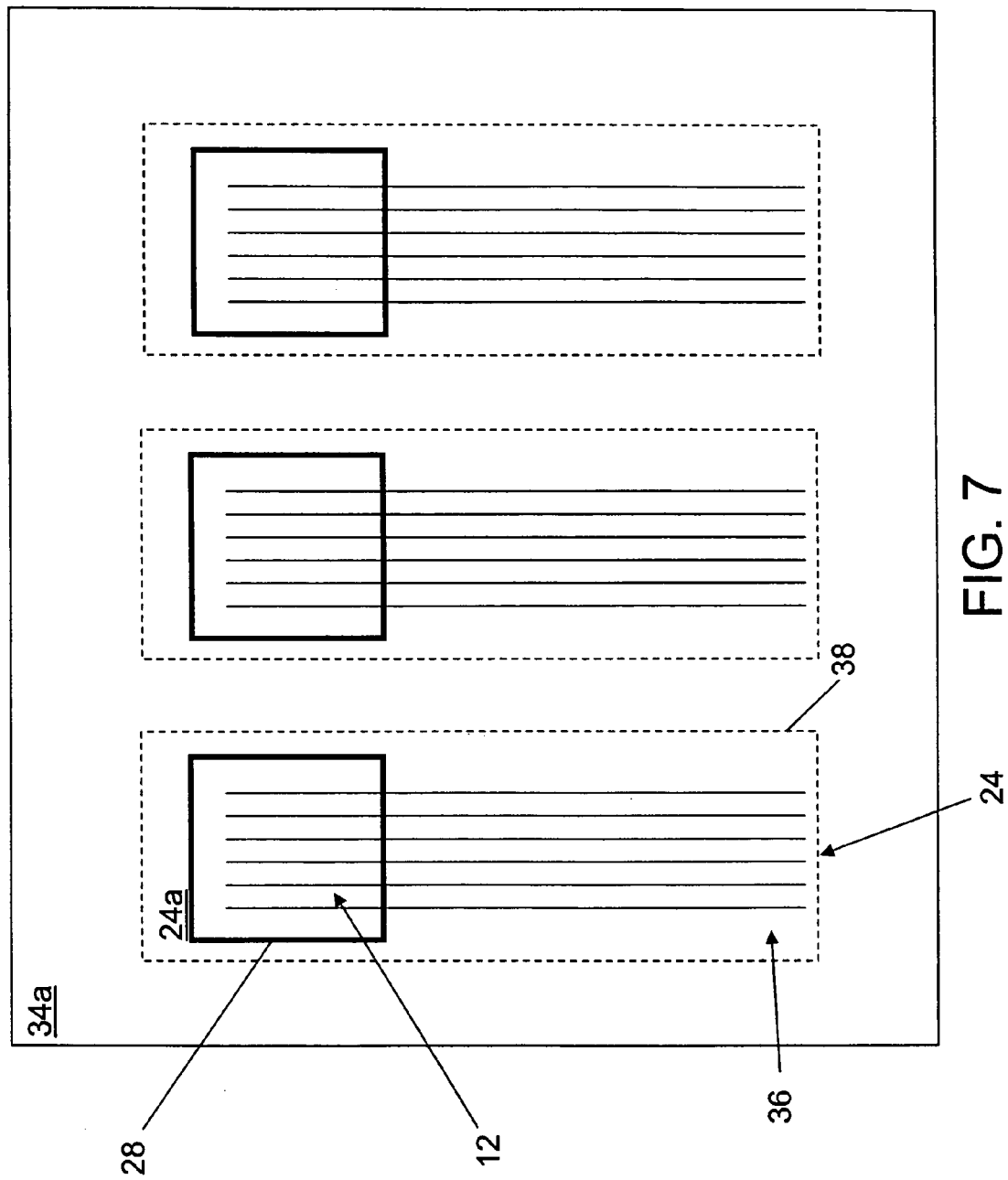
Figure 8:
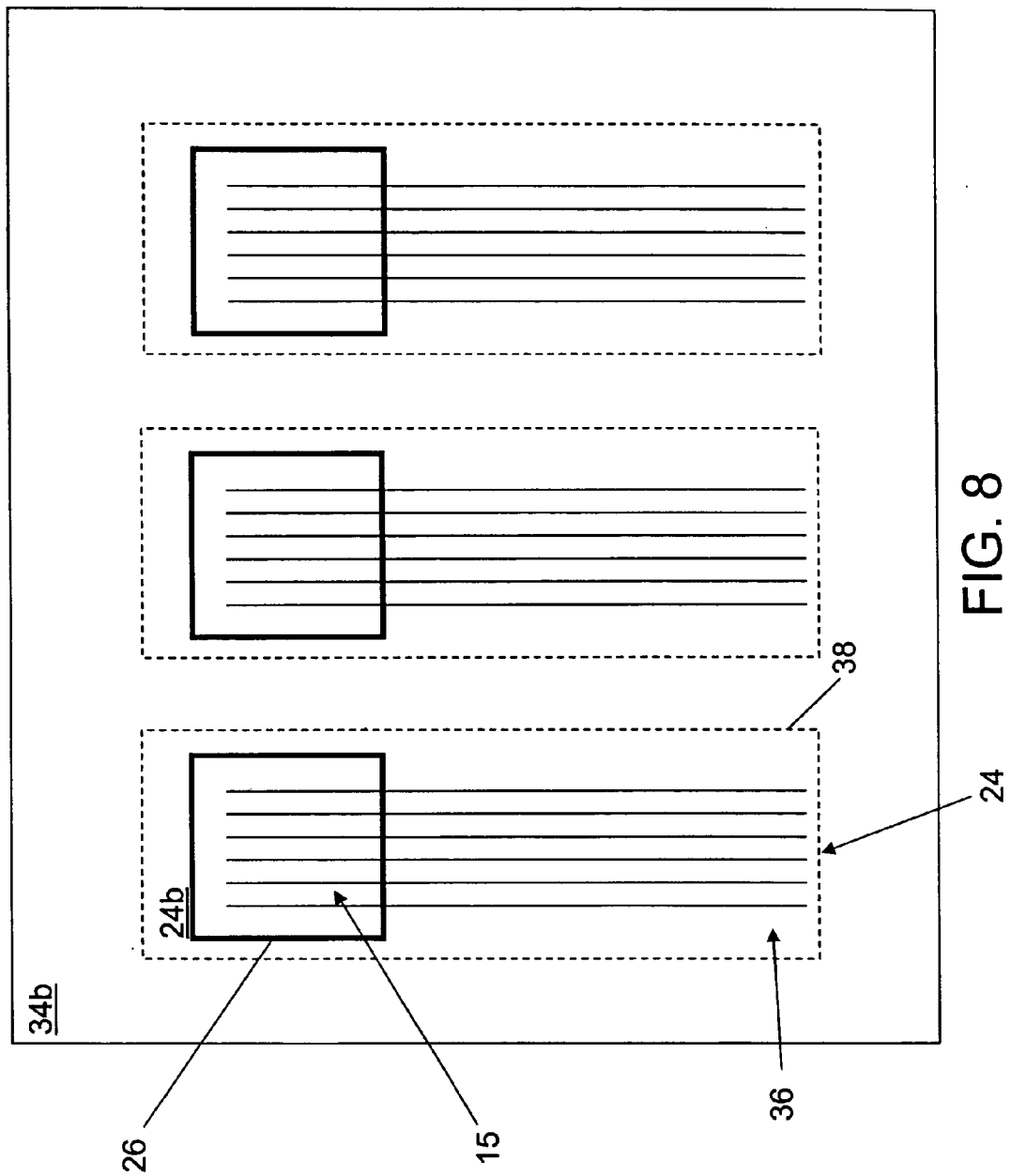
FIG. 8 illustrates a bottom-up view of a further stage of processing of the plurality of FIG. 7 semiconductor die packages.

FIG. 7 illustrates a top-down view of a further stage of processing of the plurality of elastomeric substrates 24. Specifically, a first support frame 28 defining a cavity 12 is formed on a first side 24a of the elastomeric substrate. As illustrated in the bottom-up view of FIG. 8, a second support frame 26 is formed on a second side 24b of the elastomeric substrate 24. The second support frame 26 also defines a cavity 15. The second support frame 26 is formed such that the cavity 12 defined by the first support frame 28 and the cavity 15 defined by the second support frame 28 are substantially aligned.

Figure 9:
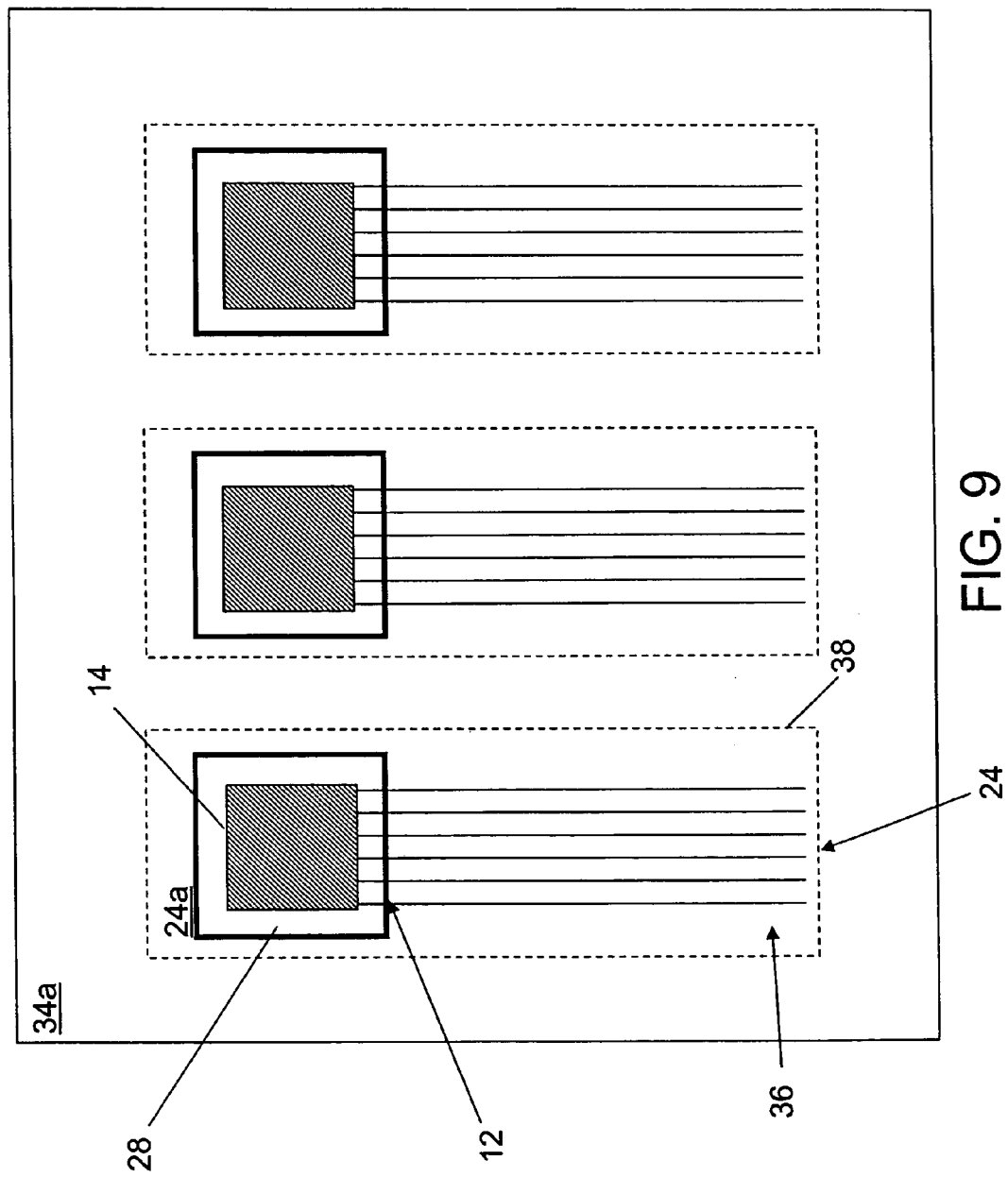
FIG. 9 illustrates a top-down view of a further stage of processing of the plurality of FIG. 8 semiconductor die packages.

FIG. 9 illustrates a further stage of processing. Specifically, FIG. 9 illustrates a top-view of a semiconductor die 14 placed within the cavity 12 defined by the first support frame 28. The semiconductor die 14 is electrically coupled to the conductive lines 36 by wire bonds 13 (e.g., FIG. 2B).

Figure 10:
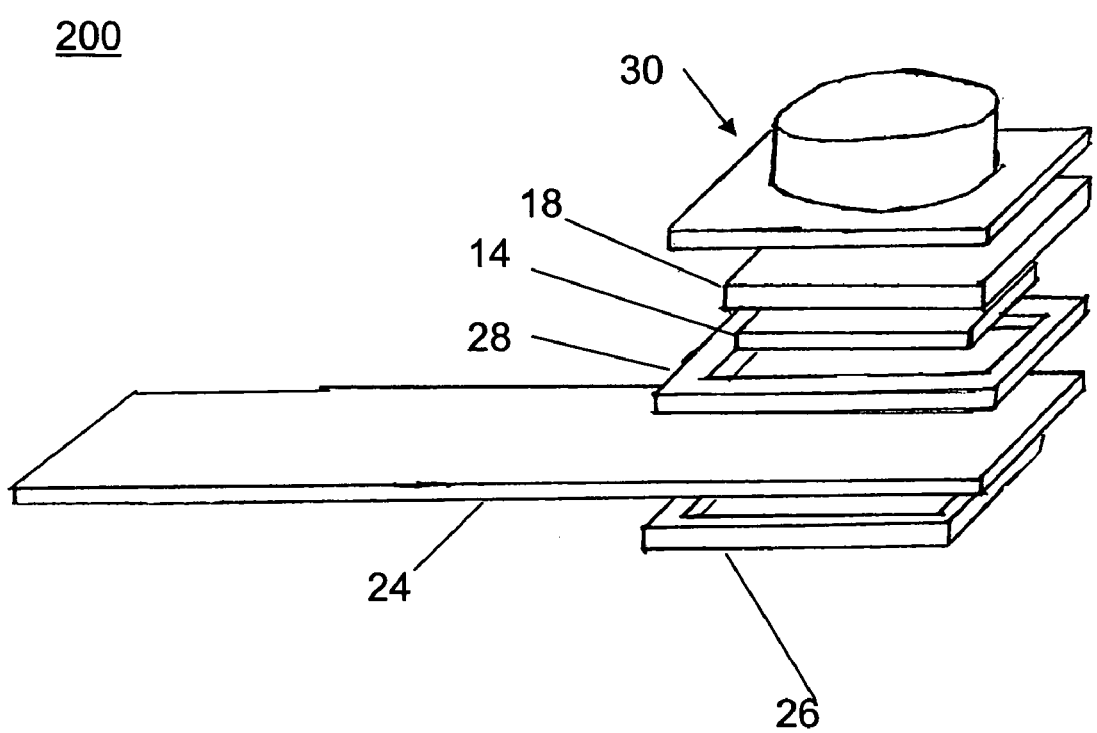
FIG. 10 illustrates an exploded view of a further stage of processing of the plurality of FIG. 9 semiconductor die packages.

FIG. 10 illustrates an exploded view of a further stage of processing, wherein the FIG. 9 structure is cut or stamped from the elastomeric film precursor 34, and additional processing occurs. For example, an IR lens 18 and a lens housing 30 having one or more lenses (e.g., 32a, 32b, 32c) may be formed over the first support frame 28, resulting in semiconductor die package 200. Further processing such as adding an IR lens 18 and a lens housing could occur prior to the FIG. 9 structure being cut or stamped from the elastomeric film precursor 34.

Figure 11:
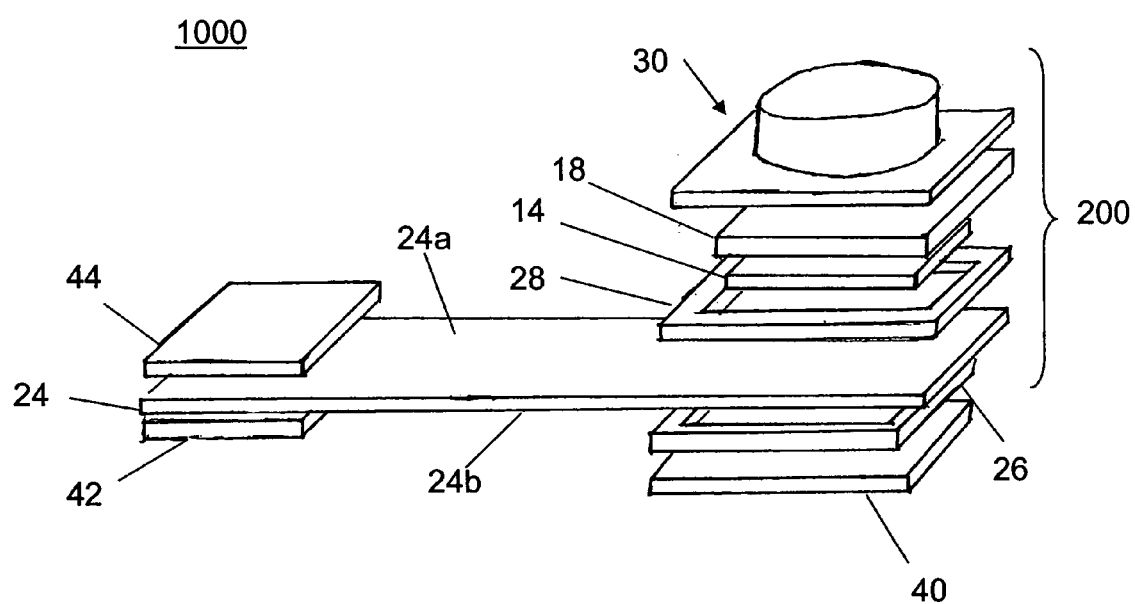
FIG. 11 is an exploded view of a semiconductor assembly 1000 incorporating a semiconductor die package constructed in accordance with an exemplary embodiment of the present invention.

At this point, the semiconductor die package 200 could be further processed to form a semiconductor assembly, as illustrated in FIG. 11. For example, an optional cushion 40 could be formed underneath the semiconductor die package 200. Additionally, an edge connector 42 having circuitry (not shown) could be formed on a second side 24a of the elastomeric substrate 24 opposite an end having the semiconductor die package 200. An optional edge connector support structure 44 can also be attached to the first side 24a of the elastomeric substrate 24.

The edge connector 42 electrically couples the semiconductor die package 200 and peripheral circuitry (not shown), such as a processor, through the conductive lines 36 (e.g., FIG. 6) formed within the elastomeric substrate 24. The optional edge connector support structure 44 provides rigidity to the portion of the elastomeric substrate 24 that is electrically connected to the edge connector 42 to allow further processing, such as, for example, inserting the semiconductor die assembly 1000 into a camera housing, thereby forming an imaging apparatus, e.g., a digital camera. The optional edge connector support structure 44 could be formed as a part of the edge connector 42, or the edge connector support structure 44 could be excluded altogether.

Although the preceding description was explained with respect to only a single embodiment, namely semiconductor die package 200, any of the aforementioned semiconductor die packages (e.g., 300, 400, 500 of FIGS. 3-5) could be formed in a similar fashion, and/or incorporated into the illustrated semiconductor assembly 1000.

Figure 12:
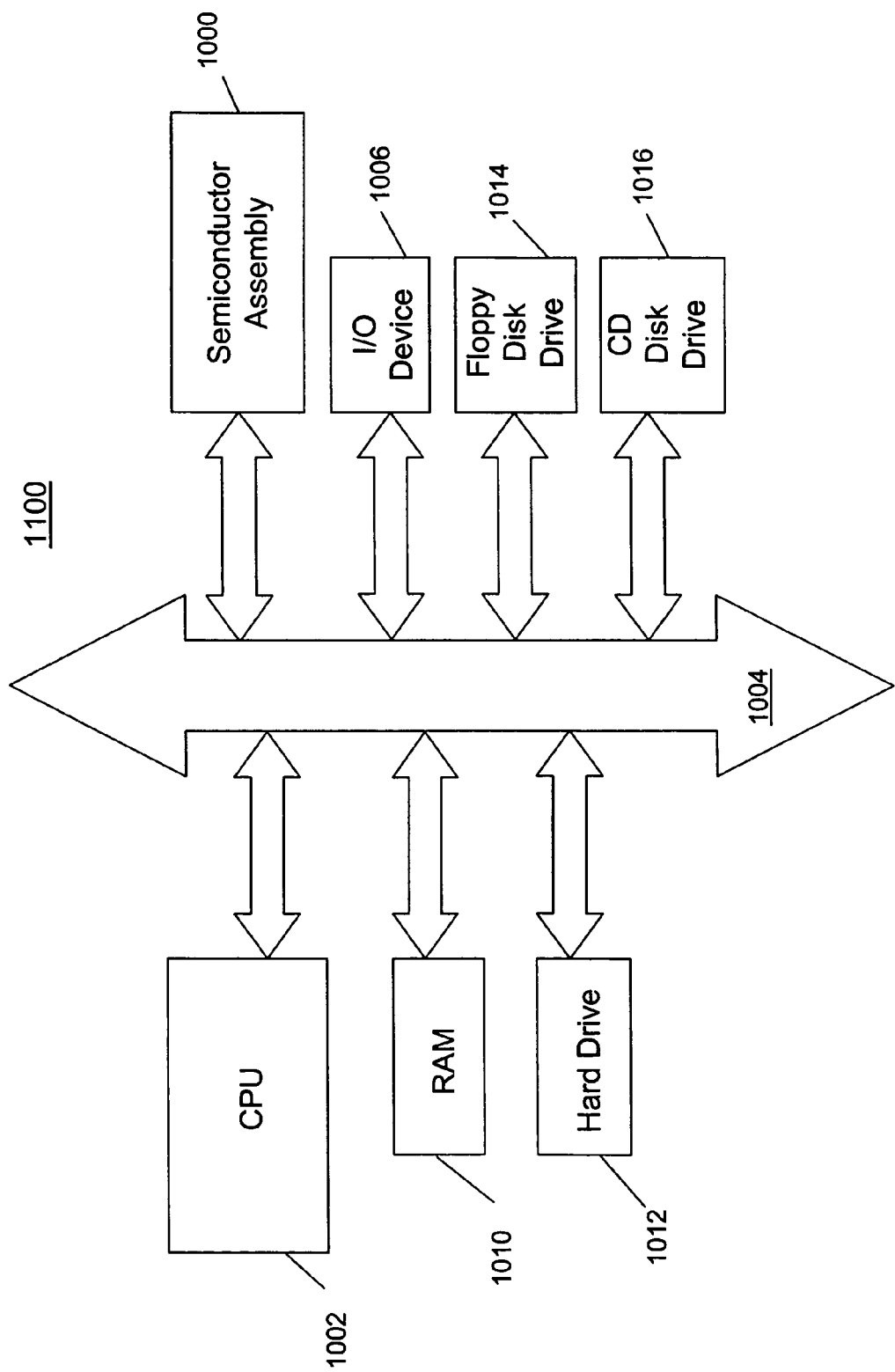
FIG. 12 is a schematic diagram of a processor system incorporating the FIG. 11 semiconductor assembly 1000.

Without being limiting, the semiconductor assembly 1000 could be part of a processor system. For example, FIG. 12 illustrates a schematic diagram of a typical processor system 1100 including the semiconductor assembly 1000 of FIG. 11. System 1100 includes a semiconductor assembly 1000 having the overall configuration depicted in FIG. 11. System 1100 includes a processor 1002 having a central processing unit (CPU) that communicates with various devices over a bus 1004. Some of the devices connected to the bus 1004 provide communication into and out of the processor based system 1100; an input/output (I/O) device 1006 and the semiconductor assembly 1000 are examples of such communication devices. Other devices connected to the bus 1004 provide memory, illustratively including a random access memory (RAM) 1010, hard drive 1012, and one or more peripheral memory devices such as a floppy disk drive 1014 and compact disk (CD) drive 1016. The semiconductor assembly 1000 may receive control or other data from CPU 1002 or other components of system 1100. The semiconductor assembly 1000 may, in turn, provide signals defining images to processor 1002 for image processing, or other image handling operations.

It should be noted that although the invention has been described with specific references to a semiconductor die package containing a semiconductor die such as a CCD or CMOS sensor, the invention has broader applicability and may be used with any imaging or even a displaying semiconductor die. In the latter case, an image is displayed on the semiconductor die 14, and viewed through the lens housing 30 having one or more lenses, e.g., a plurality of lenses 32a, 32b, 32c illustrated in FIG. 2B.

The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

The invention claimed is:

1. A method of forming a semiconductor die package, said method comprising the acts of:
   forming a first support frame on at least one of first and second surfaces of a flexible substrate, said first support frame defining a cavity;
   forming a second support frame on the other of said first and second surfaces of said flexible substrate;
   positioning a semiconductor die having an array of pixels within said cavity defined by said first support frame; and
   forming a lens structure over said semiconductor die, said lens structure having an optical path to said array of pixels.

2. The method of claim 1, further comprising the step of forming a cavity within said second support frame.

3. The method of claim 2, wherein said cavity defined by said second support frame is substantially aligned with said cavity defined by said first support frame.

4. The method of claim 2, further comprising the step of forming a rigid structure within said cavity defined by said second support frame.

5. The method of claim 4, further comprising the step of forming a heat conductive element within said rigid structure.

6. The method of claim 1, wherein said step of forming said first and second support frames further comprises coupling said first and second support frames to each other through holes formed within said flexible substrate.

7. The method of claim 1, wherein said flexible substrate is an elastomeric substrate.

8. The method of claim 7, wherein said elastomeric substrate is selected from a group consisting of epoxy, polyimide, and polyester.

9. The method of claim 7, wherein said polyimide consists of DuPont Kapton®.

10. The method of claim 7, wherein said elastomeric substrate is selected from a material capable of withstanding a 180° angle bend at a radius of at least ⅛" or less.

11. The method of claim 7, wherein said elastomeric substrate is selected from a material having a tensile strength of about 10 kpsi or greater, as measured by ASTM D-882-83 Method A.

12. The method of claim 7, wherein said elastomeric substrate is selected from a material having a tensile modulus of about 200 kpsi or greater, as measured by ASTM D-882-83 Method A.

13. The method of claim 7, wherein said elastomeric substrate is selected from a material having an elongation property of about 25% or more, as measured by ASTM D-882-83 Method A.

14. The method of claim 7, further comprising the step of forming at least one conductive line within said elastomeric substrate.

15. The method of claim 14, further comprising the step of electrically coupling said semiconductor die with said at least one conductive line by wire bonds.

16. The method of claim 14, further comprising the step of electrically coupling said semiconductor die with said at least one conductive line by conductive pads.

17. The method of claim 1, further comprising the step of forming an infrared lens over said semiconductor die.

18. A method of forming a semiconductor assembly, said method comprising:

forming a semiconductor die package, said semiconductor die package formed by the steps comprising;

forming a first support frame on at least one of first and second surfaces of a flexible substrate, said first support frame defining a cavity, forming a second support frame on the other of said first and second surfaces of said flexible substrate, positioning a semiconductor die having an array of pixels within said cavity defined by said first support frame, and forming a lens structure over said semiconductor die, said lens structure having an optical path to said array of pixels; and electrically coupling an edge connector to said semiconductor die package.

19. The method of claim 18, wherein said flexible substrate is selected from a material capable of withstanding a 180° angle bend at a radius of at least ⅛" or less.

20. A method of forming an imaging apparatus, said method comprising:

providing a processor; and coupling an image sensing unit having a semiconductor die package to said processor, said semiconductor die package formed by the steps comprising;

forming a first support frame on at least one of first and second surfaces of a flexible substrate, said first support frame defining a cavity, forming a second support frame on the other of said first and second surfaces of said flexible substrate, positioning a semiconductor die having an array of pixels within said cavity defined by said first support frame, and forming a lens structure over said semiconductor die, said lens structure having an optical path to said array of pixels.

* * * * *